(12) United States Patent
Nystrom et al.

(10) Patent No.: US 7,569,424 B2
(45) Date of Patent: Aug. 4, 2009

(54) METHOD OF FORMING A WALL STRUCTURE IN A MICROELECTRONIC ASSEMBLY

(75) Inventors: Michael J. Nystrom, San Jose, CA (US); Christopher Paul Wade, Los Gatos, CA (US); Giles Humpston, Aylesbury (GB)

(73) Assignee: Tessera, Inc., San Jose, CA (US)

( * ) Notice: Subject to any disclaimer, the term of this patent is extended or adjusted under 35 U.S.C. 154(b) by 378 days.

(21) Appl. No.: 11/600,289

(22) Filed: Nov. 15, 2006

(65) Prior Publication Data

US 2008/0113470 A1    May 15, 2008

(51) Int. Cl.
*H01L 21/50* (2006.01)
*H01L 21/48* (2006.01)
*H01L 21/44* (2006.01)

(52) U.S. Cl. .................. 438/119; 438/118; 438/116
(58) Field of Classification Search ................. 438/116, 438/118, 119
See application file for complete search history.

(56) References Cited

U.S. PATENT DOCUMENTS

| 6,379,988 | B1 * | 4/2002 | Peterson et al. ................ 438/51 |
| 6,782,610 | B1 | 8/2004 | Iijima et al. |
| 6,826,827 | B1 | 12/2004 | Fjelstad |
| 7,288,757 | B2 * | 10/2007 | Farnworth et al. .......... 250/239 |
| 2005/0116326 | A1 | 6/2005 | Haba et al. |
| 2005/0284658 | A1 | 12/2005 | Kubota et al. |

OTHER PUBLICATIONS

U.S. Appl. No. 60/847,504, filed Sep. 27, 2006.

* cited by examiner

*Primary Examiner*—Luan C Thai
(74) *Attorney, Agent, or Firm*—Lerner, David, Littenberg, Krumholz & Mentlik, LLP

(57) ABSTRACT

A method of forming a wall structure in a microelectronic assembly includes selectively depositing a flowable material on an upper surface of a first element in the microelectronic assembly, positioning a molding surface in contact with the deposited flowable material and controlling a distance between the upper surface of the first element and the molding surface with one or more objects positioned between the upper surface and the molding surface.

18 Claims, 6 Drawing Sheets

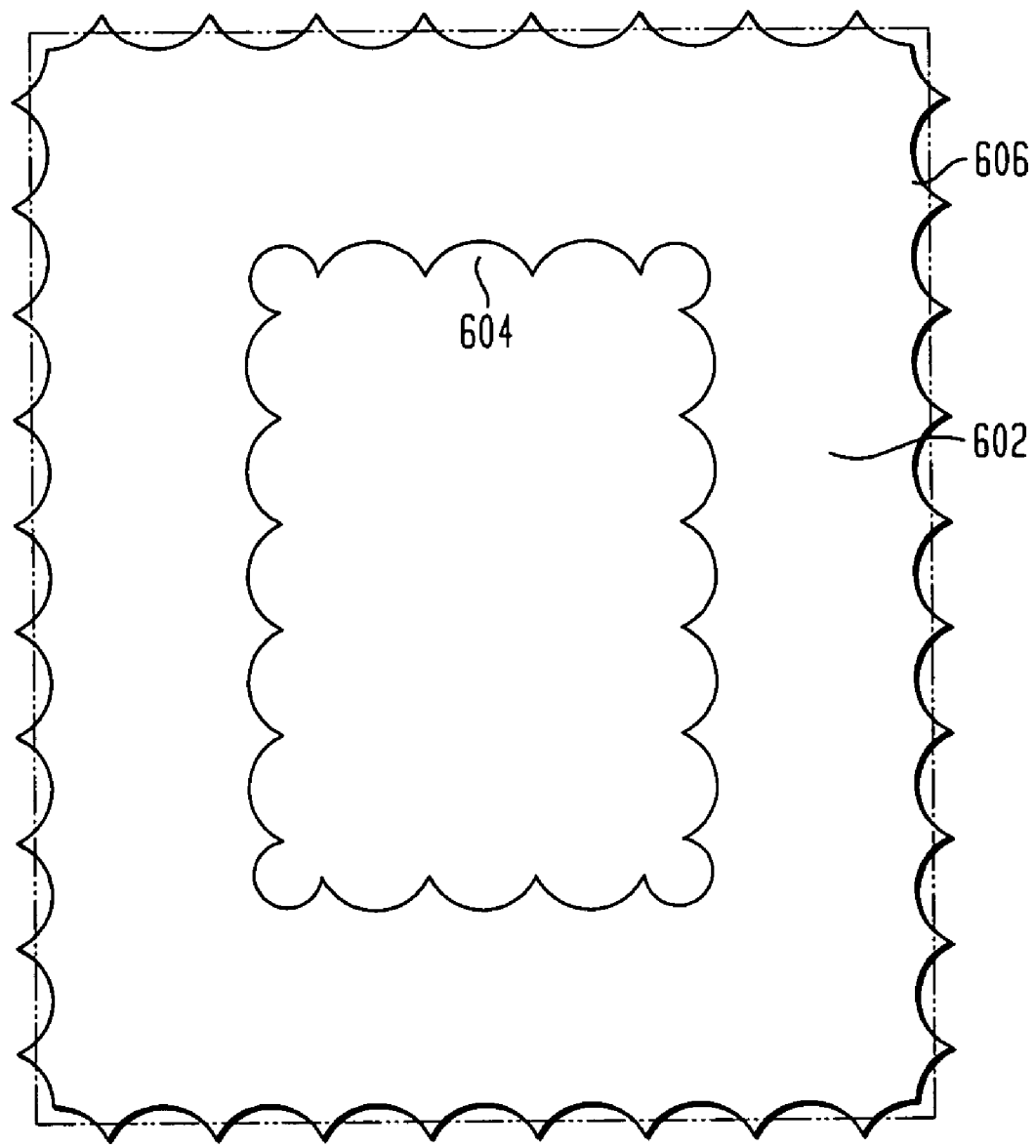

METHOD OF FORMING A WALL STRUCTURE IN A MICROELECTRONIC ASSEMBLY

FIELD OF THE INVENTION

The present disclosure relates to a microelectronic assembly and, more particularly, to a method of forming a wall structure in a microelectronic assembly.

BACKGROUND OF THE INVENTION

Wall structures in an integrated circuit device typically separate different sections of circuitry and/or seal certain sections of circuitry from external ambient conditions. As disclosed, for example, in certain embodiments of U.S. Pat. No. 6,777,767 and United States published patent application 2005/0095835, the disclosures of which are incorporated by reference herein, a wall is provided around an image sensor region of an integrated circuit device. In some instances, an image sensor is provided on a substrate, a substantially transparent or translucent lid is positioned above the image sensor and a wall is provided that extends from the substrate to the lid. In such applications, the wall, in conjunction with the lid, helps prevent contamination from reaching the image sensor region by sealing that region from ambient conditions. The walls may support the lid above the surface of the integrated circuit device. Walls are similarly used in devices that include microelectromechanical systems (MEMs), surface acoustic wave ("SAW") devices and other structures.

Integrated circuit chips typically are made as portions of a wafer including many chips, which is then severed to provide the individual chips. Typically, it is desirable to place the walls and the lids on the chips before severing the wafer. For example, wafer-size lid element can be assembled with the wafer. The walls may be formed as a separate element which is placed between the lid and the wafer, or may be provided by etching the lid to form walls projecting from the lid. It would be desirable to provide an economical process for forming walls. However, the walls must be of substantially uniform height, and must be placed precisely so that the walls do not interfere with the function of the chips. For example, in the case of image sensor chips, the walls should not overlie the sensing elements on the chip. The need for accurate placement of the walls is made more acute by the small size of the chips and formation of the chips in close proximity to one another on the wafer.

SUMMARY OF THE INVENTION

One aspect of the invention includes a method of forming a wall structure in a microelectronic assembly. The method includes selectively depositing a flowable material on an upper surface of a first element of the microelectronic assembly, positioning a molding surface in contact with the deposited flowable material and controlling a distance between the upper surface of the first element and the molding surface with one or more objects positioned between the upper surface and the molding surface.

In some implementations, the one or more objects used to control the distance between the upper surface of the first element and the molding surface are pins. The pins have distal ends that extend from the molding surface toward the upper surface of the first element. In those implementations, the distal ends extend approximately equidistant from the molding surface. The method also includes applying a compressive force against an upper surface of the flowable material with the molding surface, thereby causing the distal ends of the pins to contact the upper surface of the first element. Therefore, controlling the distance between the upper surface of the first element and the molding surface comprises using the pins to resist the applied compressive force.

According to certain implementations, the one or more objects are particles suspended in the flowable material. The suspended particles can be substantially spherical and have substantially identical diameters. In those instances, the method includes applying a compressive force to the flowable material with the molding surface and the first element until at least three of the suspended particles are in contact with both the upper surface of the first element and the molding surface. Controlling the distance between the upper surface of the first element and the molding surface includes using the suspended particles that are in contact with both the upper surface of the first element and the molding surface to resist the applied compressive force.

Some implementations include substantially planarizing the top surface of the flowable material with the molding surface.

In some implementations, the molding surface is part of an integrated circuit wafer and the flowable material is an adhesive. In those instances, the method can include curing the adhesive to form a bond between the molding surface and the adhesive. Certain implementations include flowable material that is an adhesive and a molding surface that is adapted to resist bonding to the adhesive. In those instances, the method includes at least partially curing the adhesive while controlling the distance between the upper surface of the first element and the molding surface. Then, after at least partially curing the adhesive, the molding surface is removed from the adhesive. Subsequently, a second element is coupled to the adhesive and further curing of the adhesive to bond the integrated circuit wafer to the adhesive is performed.

According to some implementations, selectively depositing the flowable material includes screen printing the flowable material at selected positions on the upper surface, utilizing a stencil to deposit the flowable material at selected positions on the upper surface, or other techniques to deposit the flowable material.

In certain implementations, selectively depositing the flowable material comprises forming a side surface of flowable material adjacent that is adapted to resist flowing in an outward direction. More particularly, the side surface can be scalloped. Generally, the flow-resistant side surface is adjacent to an active (or otherwise sensitive) region selected, for example, from the group consisting of an image sensor region, an electrical contact region, a movable device region, a surface acoustic wave region and combinations thereof.

The flowable material can be an ultraviolet curable adhesive. In some of those implementations, the first element is adapted to allow the passage of ultraviolet radiation sufficient to aid in curing the flowable material and the method includes at least partially curing the adhesive by passing ultraviolet light through the first element.

Some implementations include providing a first element that is a transparent lid wafer formed from a material that readily permits the passage of light or other type of electromagnetic radiation.

Another aspect of the invention includes a method of forming a wall structure in a microelectronic assembly. The method includes selectively depositing an adhesive on an upper surface of a transparent lid wafer of the microelectronic assembly. Then, a substantially flat molding surface is positioned in contact with the adhesive. The distance between the upper surface of the transparent lid wafer and the molding surface is controlled with one or more objects positioned between the upper surface and the molding surface. While controlling the distance, the adhesive is partially cured. After partially curing the adhesive, the molding surface is removed to expose one or more substantially planar adhesive surfaces. Next, a semiconductor wafer is placed in contact with at least one of the substantially planar adhesive surfaces and the adhesive is further cured to bond the semiconductor wafer to the at least one substantially planar adhesive surface.

In some implementations, the one or more objects are pins having distal ends that extend approximately equidistant from the molding surface toward the upper surface of the transparent lid wafer. In those implementations, the method includes applying a compressive force to the adhesive with the molding surface and the transparent lid wafer to cause the distal ends of the pins to contact the upper surface of the first element. Moreover, controlling the distance between the upper surface of the transparent lid wafer and the molding surface includes using the pins to resist the applied compressive force.

In some implementations, the one or more objects are substantially spherical particles having substantially identical diameters and the substantially spherical particles are suspended in the selectively deposited adhesive. In those implementations, the method includes applying a compressive force to the adhesive with the molding surface and the first element until at least three of the substantially spherical particles is in contact with both the upper surface of the transparent lid wafer and the molding surface. Moreover, controlling the distance between the upper surface of the transparent lid wafer and the molding surface comprises using the substantially spherical elements that are in contact with both the upper surface of the transparent lid wafer and the molding surface to resist the applied compressive force.

In some implementations, one or more of the following advantages are present.

The process of forming a wall structure in an integrated circuit device can be greatly simplified. Manufacturing processes might be simplified. Simplified manufacturing processes might reduce the time and costs associated with manufacturing. Other features and advantages will be apparent from the following description, claims and drawings.

BRIEF DESCRIPTION OF THE DRAWINGS

FIG. 6 is a pattern of a screen that can be used to selectively deposit flowable material to form a wall structure.

Like reference numerals indicate like elements.

DETAILED DESCRIPTION

Figure 1:
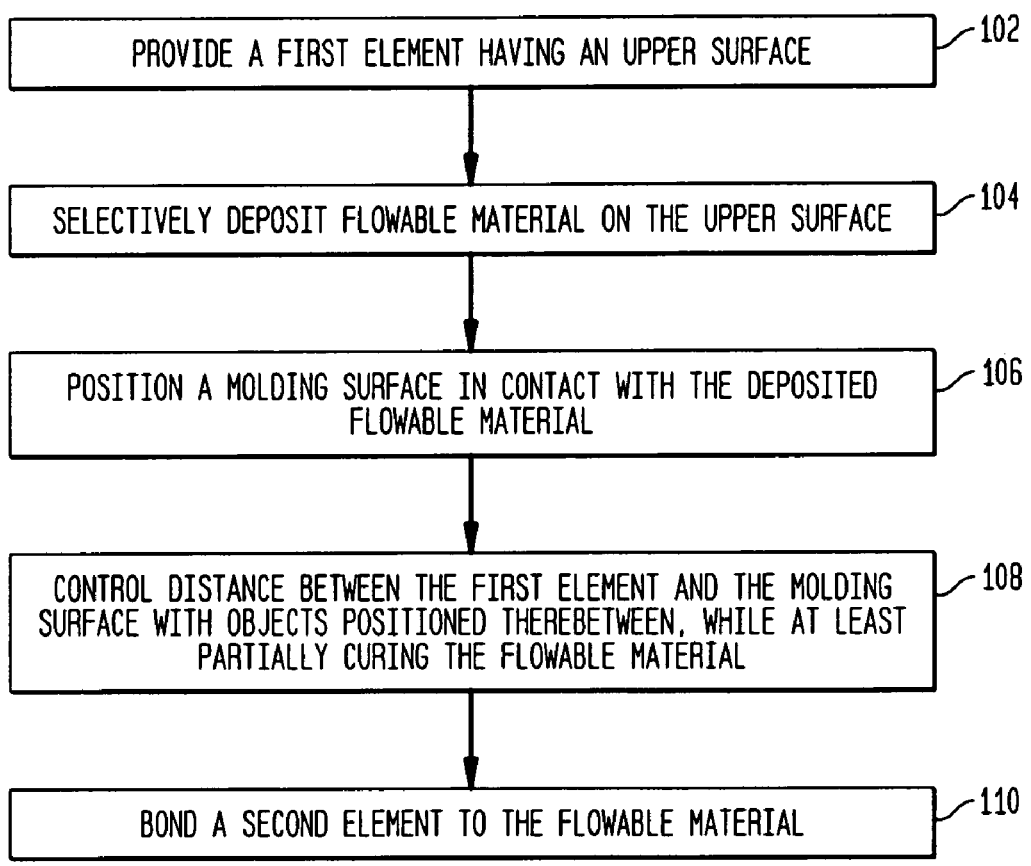
FIG. 1 is a flowchart illustrating a method of forming a wall structure in an integrated circuit device.
Figure 2A:
FIGS. 2A-2H are side views of an integrated circuit device being processed in accordance with one implementation of the method of FIG. 1.
Figure 2B:
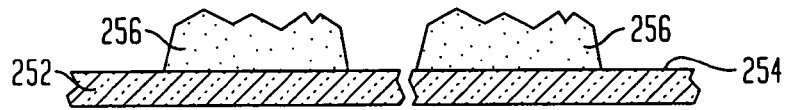
Figure 2C:
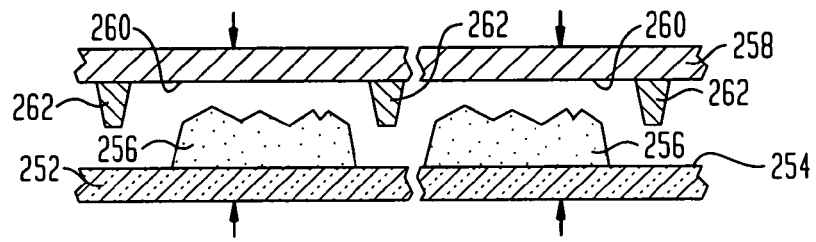
Figure 2D:
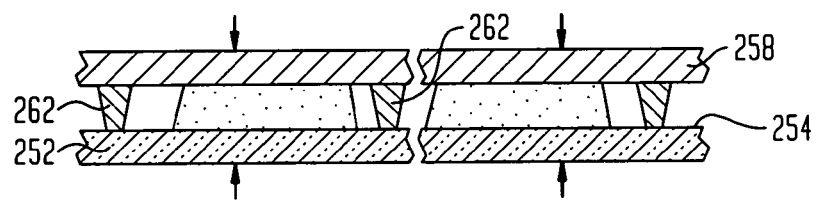
Figure 2E:
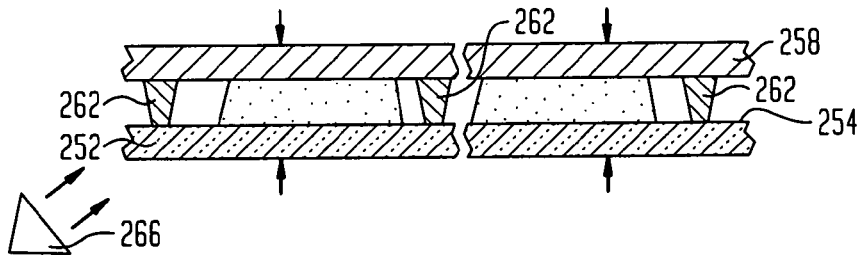
Figure 2F:
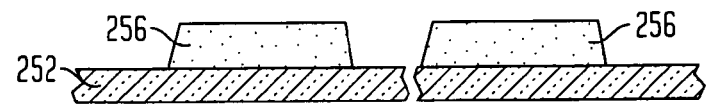
Figure 2G:
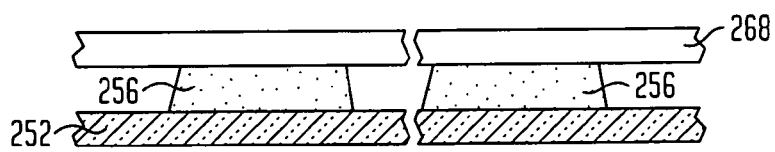
Figure 2H:
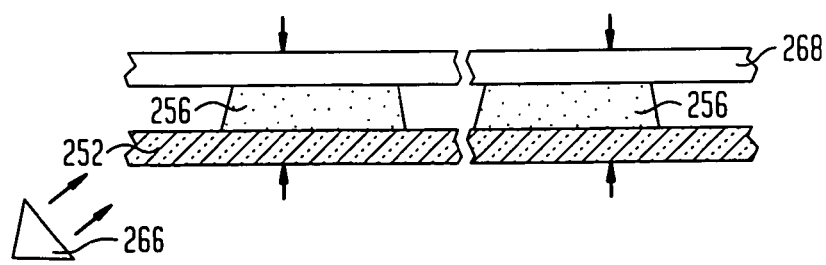
Figure 3A:
FIGS. 3A-3H are side views of an integrated circuit device being processed in accordance with another implementation of the method of FIG. 1.
Figure 3B:
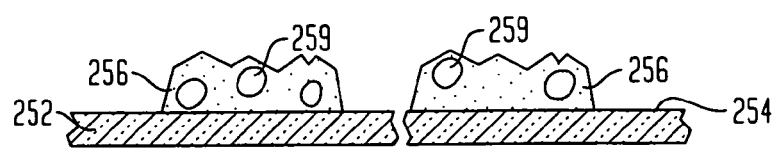
Figure 3C:
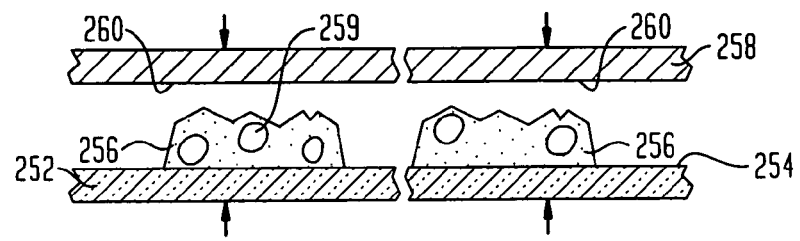
Figure 3D:
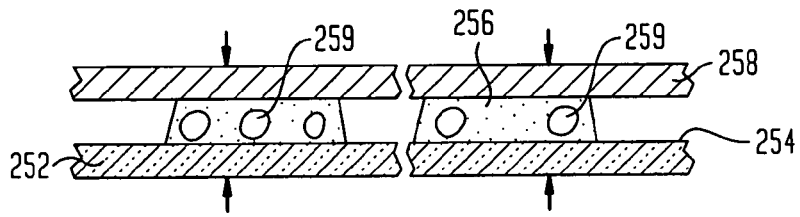
Figure 3E:
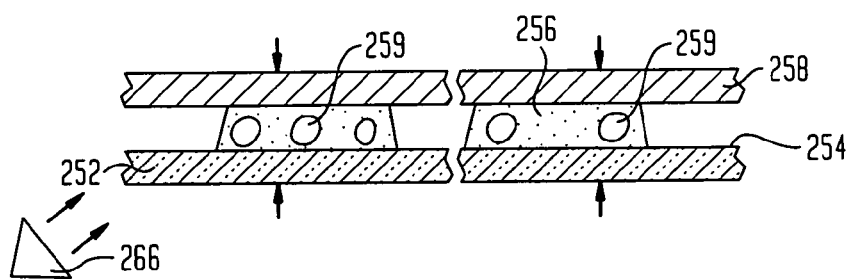
Figure 3F:
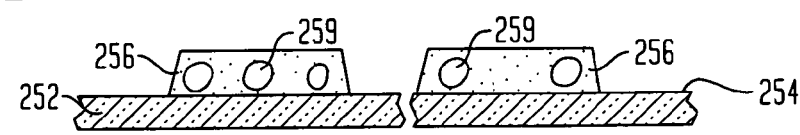
Figure 3G:
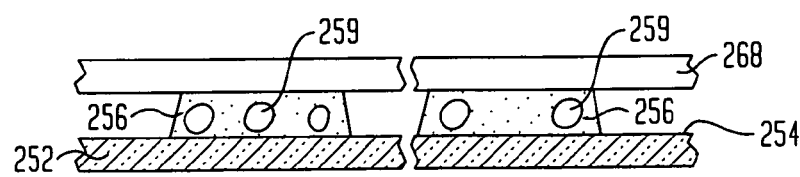
Figure 3H:
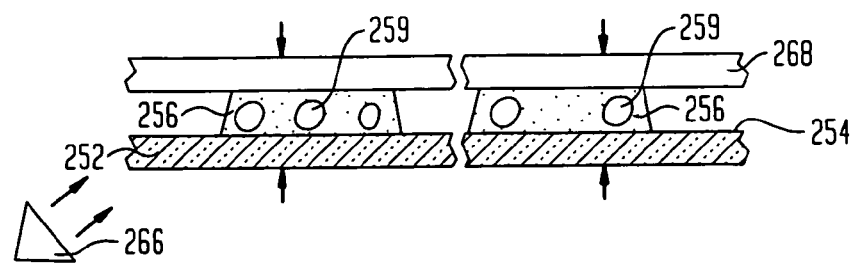

FIG. 1 is a flowchart illustrating a method of forming a wall structure in an integrated circuit device. The illustrated method includes providing 102 a first element having an upper surface. A flowable material is then selectively deposited 104 onto the upper surface of the first element. Once the flowable material has been deposited, a molding surface is positioned 106 to contact an upper surface of the deposited flowable material. While the flowable material at least partially cures, the distance between the upper surface of the first element and the molding surface is controlled with objects that are positioned therebetween. Finally, the illustrated method includes bonding 110 a second element to the flowable material.

FIGS. 2A-2H are side views of an integrated circuit device being processed in accordance with one implementation of the method of FIG. 1.

The illustrated implementation includes providing a first element 252 having an upper surface 254. See FIG. 2A. The illustrated first element 252 is a transparent lid wafer formed from a material that readily permits the passage of light or other type of electromagnetic radiation. Examples of suitable materials include substantially transparent and/or translucent glass or plastic.

A flowable material 256 (e.g., an adhesive) is selectively deposited on the upper surfaces 254 of the first element 252. See FIG. 2B. Advantageously, the flowable material can be deposited using techniques that do not result in an even upper surface of flowable material. That is because it is not necessary to control the height of the deposited material precisely when selectively depositing the flowable material 256. As illustrated, the upper surfaces of the flowable material 256 deposits are quite uneven when deposited. Accordingly, the flowable material 256 can be selectively deposited using simple screen printing techniques or by using a stencil or by using any other suitable technique for applying flowable material. If screen printing techniques or stencils are utilized, the design of the screen or stencil can help control where the flowable material is deposited.

In a typical implementation, deposits of flowable material 256 are positioned relatively far apart from each other. In some instances, they are on opposite sides of the first element 254. Accordingly, the illustrated figures indicate a break between the two deposits of flowable material 256.

After the flowable material 256 is deposited, a molding element 258 having a molding surface 260 is positioned in contact with an upper surface of the deposited flowable material 256. See FIGS. 2C and 2D. The molding element 258 is a rigid structure and the molding surface 260 is substantially flat. As shown, the molding surface 260 is positioned so as to contact upper surfaces of the flowable material 206. However, in certain implementations, the molding surface 260 may contact other surfaces (e.g., certain side surfaces) of the flowable material 256 to shape the flowable material 256 as desired.

Pins 262 extend from the molding surface 260 toward the first element 252. The pins 262 are rigid and are adapted to resist compression in an axial direction. Each pin 262 extends approximately the same distance from the molding surface 260 and has a substantially flat distal end 264.

One way to form pins 262 that have substantially identical heights and substantially flat distal ends 264 is to secure a substantially flat plate to a substrate (e.g., molding element 258) and, subsequently, etch away portions of the flat plate to leave only pins. If such an etching process is used to form the pins 262, then the molding element 258 should be a material that is substantially impervious to the etching process. Of course, other methods of pin formation are possible. Processes for forming posts in conjunction with other elements of a circuit panel are shown, for example, in U.S. Pat. Nos.

6,782,610 and 6,826,827; U.S. Published Patent Application Nos. 2005-0116326 A1 and 2005-0284658; as well as in U.S. Provisional Patent Application No. 60/847,504, the disclosures of which are all incorporated by reference herein.

It is generally desirable for the molding surface 260 to be brought into contact with the flowable material 256 as soon as possible after the flowable material 206 has been selectively deposited so that the flowable material 206 will not have had a chance to significantly cure (i.e., become less flowable) before contact is established. If contact is established quickly, the flowable material 256 will be easier to mold.

The pins 262 help control the distance between the first element 252 and the molding surface 260 while the flowable material 256 at least partially cures. See FIG. 2E. More particularly, the pins between the first element 252 and the molding surface 260 counteracts an externally applied force (indicated by the arrows) to control the distance. As illustrated, that technique maintains the molding surface 260 approximately parallel to the upper surface 254 of the first element 252. Accordingly, the molding surface 260 molds a substantially flat upper surface of each flowable material 256 deposit. That substantially flat upper surface is substantially parallel to the upper surface 254 of the first element 252.

The externally applied force (indicated by the arrows) could be applied by a person, machine or could simply be related to gravity pulling the molding element 258 and the first element 252 together. It is desirable, but not necessary, that the compressive force be applied in a continuous manner until the flowable material 256 has at least partially cured. Additionally, it is desirable that the compressive force be applied in a manner that is approximately evenly distributed.

A curing device 266 is provided to facilitate curing of the flowable material 256. The illustrated curing device 266 is arranged to direct ultraviolet energy substantially towards a bottom surface of the first element 252. Since the first element is substantially transparent or translucent to ultraviolet energy, the ultraviolet energy passes through the first element 252 and reaches the flowable material 256. In the illustrated implementation, the molding surface 260 remains in place while the flowable material 256 is at least partially cured.

It is generally desirable to continue controlling the distance between the upper surface 254 of the first element 252 and the molding surface 260 throughout at least partial curing. As illustrated, that distance is controlled by virtue of the distal ends 264 of the pins 262 contacting the upper surface 204. In most instances, the distal ends 264 of at least some (if not all) of the illustrated pins 262 are in contact with the upper surfaces 254 of the first elements 252. It is desirable that most, if not all, of the distal ends 264 contacts the upper surface 254. In the illustrated implementation, the pins 262 resist deformation under the applied compressive force.

Once the flowable material 256 has cured to a predetermined point, the molding element 258 is removed. See FIG. 2F. Typically, that predetermined point is sometime after the flowable material 256 has cured (i.e., hardened) sufficiently so that the molded upper surface of the flowable material will hold its shape when the molding element 258 is removed. The partial cure typically causes the adhesive to gel, a gel being approximately halfway between a liquid and a solid. It is generally desirable that the molding element be removed before the flowable material cures completely. Indeed, the upper surface of flowable material 256 should have some adhesiveness after the molding element is removed. Accordingly, as shown in the illustrated implementation, removal of the molding element 258 exposes a substantially flat upper surface of flowable material that has some degree of adhesiveness.

Since the molding element 258 is removed from the partially cured flowable material, it is desirable that the molding surface 260 be adapted to resist bonding to the flowable material 256 when the flowable material partially cures. That resistance to bonding can be inherent in the material of the molding element 258 or, alternatively, can be achieved by coating the molding surface 260 with a suitable coating. Merely, by way of example, a thin silicone coating oil, a fluoropolymer or the like, can form an effective anti-adhesion coating. Resistance to bonding facilitates easy removal of the molding elements 258 after the flowable material cures to a desirable condition.

Next, a second element 268 (e.g., a semiconductor wafer) is bonded to the molded upper surface of flowable material 256. See FIG. 2G. Typically, it is desirable to position the second element 268 in contact with the molded surface as soon as possible after the molding element 258 is removed. That way, the flowable material 256 will not be fully cured and, therefore, will have some degree of adhesiveness. Adhesiveness is important because that is what helps bond the second element 268 to the flowable material 256.

After the second element 268 has been positioned in contact with the molded surface of the flowable material, the flowable material is further cured, preferably to a fully cured condition. See FIG. 2H. The cured material bonds the second element to the walls. In the illustrated implementations, a curing agent 266, such as an ultraviolet light source, is directed substantially toward the flowable material 256 to facilitate curing. Throughout that curing process, an optional compressive force (indicated by the arrows) is applied to the first and second elements 252, 268.

The resulting finished assembly may be further processed to form individual units by, for example, severing the assembly (including the wafer and the lid) to form individual units, each including a portion of the wafer, a portion of the lid, and one or more of the walls. The process of forming the walls may be combined with other process steps. For example, steps such as those shown in the aforementioned U.S. Pat. No. 6,777,767 and U.S. Patent Publication 2005/0095835, for providing features such as terminals exposed at a surface of the unit and electrically connected to the integrated circuit in each unit.

FIGS. 3A-3H are side views of an integrated circuit device being processed in accordance with another implementation of the method of FIG. 1.

The illustrated implementation is similar to the implementation shown in FIGS. 2A-2H. However, in FIGS. 3A-3H, the distance between the first element 252 and the molding element 258 is controlled by particles 259 that are suspended in the flowable material (i.e., not by pins 262 that extend from the molding element 258 as shown in FIGS. 2A-2H). The suspended particles 259 are adapted to resist deformation under pressure. Accordingly, when the molding element 258 is pressed against the flowable material (see, e.g., FIGS. 3C and 3D) the flowable material 256 is compressed until the particles 259 form a substantially single layer and at least some of the particles 262 are in contact with both the upper surface 252 of the first element 252 and the molding surface 260. Since the particles resist deformation under the pressure, further movement of the molding element 258 and the first element 254 toward each other is prevented.

The illustrated implementation is not a scaled representation. As such, it should be understood that, in a typical implementation, each deposit of flowable material 256 would include a large number of particles 259 suspended therein. When the flowable material 256 is selectively deposited on the upper surface 254 of the first element 252 (see FIG. 3B), the particles 259 are distributed throughout the flowable material 256 in a fairly uniform manner and in a manner that substantially ensures that every deposit of flowable material 256 on the upper surface 254 will contain at least one particle 259. Typically, the suspended particles 402 are formed from a non-conductive material.

FIGS. 4A-4E are side views of an integrated circuit device being processed in accordance with yet another implementation of the method of FIG. 1.

The steps shown in FIGS. 4A-4E are similar to the steps shown in FIGS. 2A-2E. However, in FIGS. 4A-4E, the molding element 258 is a semiconductor wafer. Accordingly, the molding element 258 (i.e., the semiconductor wafer) is not removed from the flowable material after molding the upper surface of the flowable material. Indeed, the molding element 258 (i.e., the semiconductor wafer) becomes a part of the final structure of the integrated circuit device.

Figure 4A:
FIGS. 4A-4E are side views of an integrated circuit device being processed in accordance with yet another implementation of the method of FIG. 1.
Figure 4B:
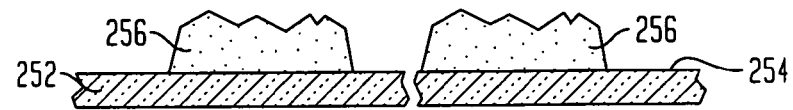
Figure 4C:
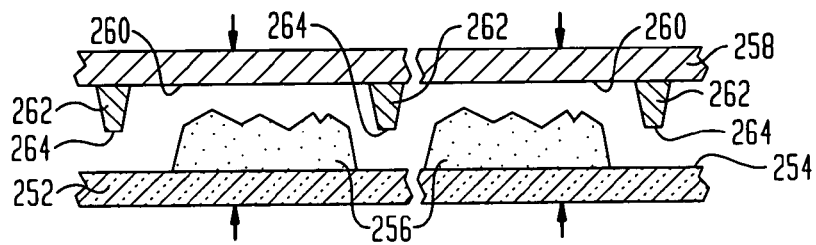
Figure 4D:
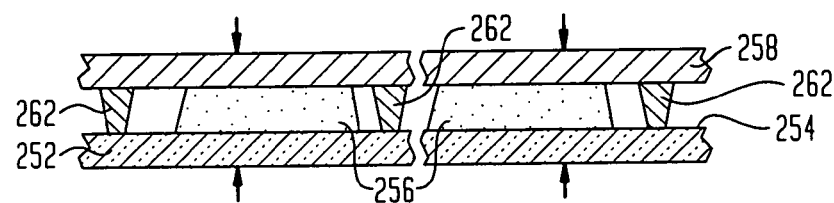
Figure 4E:
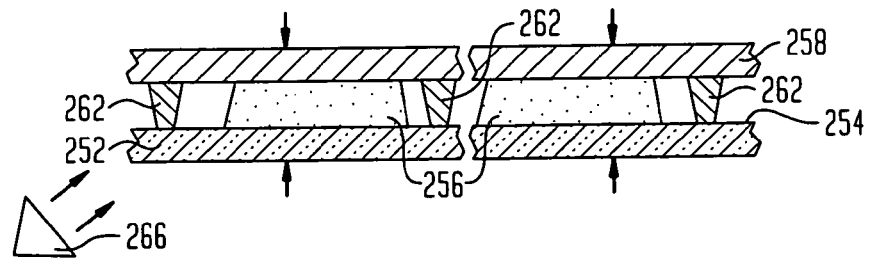

In the step shown in FIG. 4E, it is desirable that the curing agent 266 cures the flowable material completely. As such, that curing step causes the molding element 258 (i.e., the semiconductor wafer) to adhere to the molded upper surface of the flowable material 256.

The implementation illustrated in FIGS. 4A-4E has fewer steps than the implementation in FIGS. 2A-2H and in FIGS. 3A-3H. However, the implementation of FIGS. 4A-4E results in an integrated circuit device that includes the pins 262 as part of the device.

FIGS. 5A-5E are side views of an integrated circuit device being processed in accordance with still another implementation of the method of FIG. 1.

The steps shown in FIGS. 5A-5E are similar to the steps shown in FIGS. 4A-4E. However, in FIGS. 5A-5E, the distance between the first element 252 and the molding element 258 is controlled by particles 259 that are suspended in the flowable material (i.e., not by pins 262 that extend from the molding element 258 as shown in FIGS. 4A-4E). The suspended particles 259 are adapted to resist deformation under pressure. Accordingly, when the molding element 258 is pressed against the flowable material (see, e.g., FIGS. 5C and 5D), the flowable material 256 is compressed until the particles 259 form a substantially single row and at least some of the particles 262 are in contact with both the upper surface 252 of the first element 252 and the molding surface 260. Since the particles resist deformation under the pressure, further movement of the molding element 258 and the first element 254 toward each other is prevented.

In FIGS. 5A-5E, the molding element 258 is a semiconductor wafer. Accordingly, the molding element 258 (i.e., the semiconductor wafer) is not removed from the flowable material 256 after the upper surface of the flowable material 256 is molded. Indeed, the molding element 258 (i.e., the semiconductor wafer) becomes a part of the final structure of the integrated circuit device.

Figure 5A:
FIGS. 5A-5E are side views of an integrated circuit device being processed in accordance with still another implementation of the method of FIG. 1.
Figure 5B:
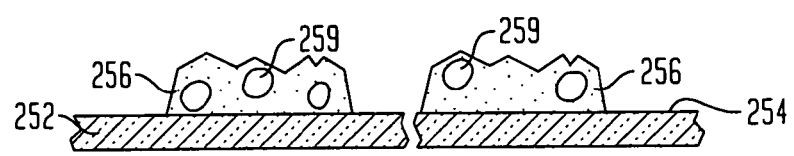
Figure 5C:
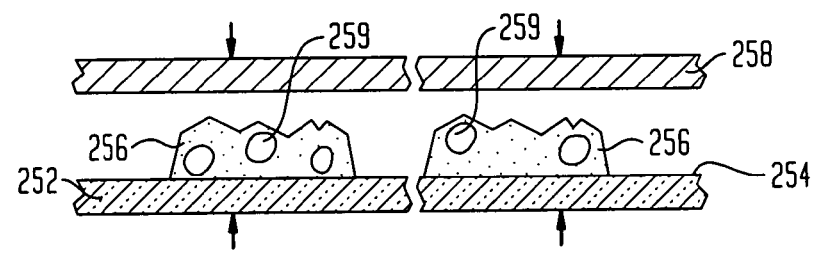
Figure 5D:
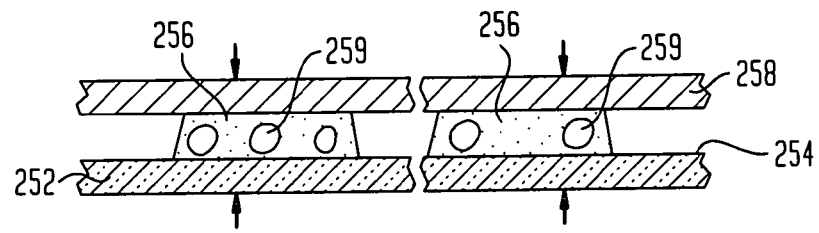
Figure 5E:
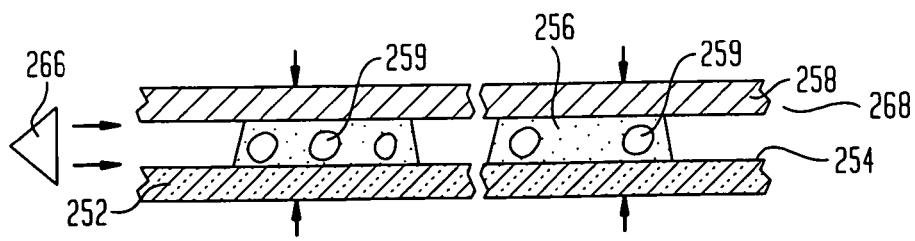

In the step shown in FIG. 5E, the curing agent 266 desirably facilitates curing of the flowable material 256 to a fully cured condition. In the illustrated implementation, the curing agent 266 is positioned adjacent a side surface of the integrated circuit device and directed inwardly toward the flowable material 256.

FIG. 6 is a plan view of a screen 602 that can be used to selectively deposit the flowable material 256 onto the upper surface 254 of the first element 252.

The illustrated screen 602 includes internal scalloped edges 604 and external scalloped edges 606. In use, the screen 602 can be positioned above the first element 252. Then, the flowable material 256 can be pressed through the screen 602 onto the upper surface of the first element 252. That can result in a selectively deposited pattern of flowable material 256 having internal and external scalloped edges.

In some implementations, the scalloped edges help prevent the flowable material 256 from expanding outwardly from the scalloped edge. That can be particularly advantageous if the flowable material is intended to be deposited close to an active (or otherwise sensitive) area of a corresponding integrated circuit device. Exemplary active areas include image sensor regions, electrical contact regions, movable device regions, surface acoustic wave regions, combinations thereof, etc. In those instances, it is particularly important for the flowable material 256 to be kept away from the active (or otherwise sensitive) area.

In other implementations, the flowable material may be selectively deposited so that it has one or more scalloped edges and one or more non-scalloped edge. In those instances, under compression, the flowable material 256 would be more likely to flow in the direction of the non-scalloped edge. So, the scalloped edge could be formed adjacent to an active (or sensitive) region and the non-scalloped edge could be formed adjacent to an inactive (or insensitive) region. Accordingly, the likelihood of damaging the active area when the flowable material is molded can be reduced.

Although the illustrated implementation shows scalloped edges, other contours are possible and may also prevent the migration of flowable material under compressive force into sensitive or active regions. Exemplary edge shapes that could resist flowing of the flowable material include saw-tooth shapes, square wave shapes, sinusoidal shapes, etc. Also, it is possible that the edges of flowable material that border sensitive or active regions can be processed in other ways to prevent material migration into those regions. For example, a portion of the edge might be spot-cured by directing a curing agent to a small portion of the edge.

Generally, reducing the possibility that the flowable material might flow into designated active areas or other sensitive regions under the influence of a compressive force is desirable.

Although the disclosure herein references particular embodiments, it is to be understood that these embodiments are merely illustrative of the principles and applications of the present invention.

For example, the order of steps may vary. Additionally, certain steps might overlap with other steps. Additional processing steps might be implemented between or in conjunction with any of the steps disclosed herein.

Additionally, a variety of materials are suitable for use as a first element, a second element and as a molding element. For example, in some implementations, the first element is a semiconductor wafer and the molding element is a transparent lid wafer made from a material that allows the passage of curing energy. In those instances, the first element 252 can include, for example, silicon, gallium arsenide, germanium, etc. Additionally, a variety of active and passive electronic components might be positioned atop the first element. In other implementations, both the first element and the molding element are transparent. Other materials are suitable for a variety of implementations.

The specific geometric shapes of the various elements and structures disclosed herein can vary. For example, although the molding surfaces disclosed herein are substantially flat, the molding surface could be contoured in a variety of ways. In those instances, the molding surface might be used to mold the flowable material into a variety of shapes. Similarly, although the upper surface of the first element disclosed herein is flat, depending on the particular application, the upper surface could include a variety of contours.

The objects used to control the distance between surfaces can vary considerably. Indeed, the pins can be a variety of shapes, sizes and materials. The exact shape of the pins 262 can, of course, vary considerably. Generally, thicker pins 262 provide greater resistance to axial compression. Thinner pins 262 can fit into tighter spacers. However, using thinner pins 262 might necessitate using more pins to realize a comparable resistance to axial compression. The angle of taper for the pins 262 can be varied as well from having virtually no taper to having a very dramatic taper.

In some implementations, the pins are the same material as the molding element 258. However, more typically, the pins 262 are a different material than the molding element 258. For example, in one implementation, the pins 262 are metallic and the molding element 258 is some other material. In some implementations, the pins are a non-conductive material. In some implementations, the pins are translucent and/or substantially transparent to energy from a curing agent.

Although the pins 262 disclosed herein extend from the molding surface, some implementations include pins that extend, instead, from the upper surface 254 of the first element 252. In other implementations, some pins might extend from the molding surface 260 and some pins might extend from the upper surface 254 of the first element 252. In other implementations, the pins could simply be positioned between the first element and the molding element without being secured to either element.

The pins disclosed herein have substantially flat distal ends. However, in some implementations, the distal ends 264 are pointed, rounded or contoured in another manner.

In certain implementations, walls (instead of pins) extend from the molding surface 210 and/or the upper surface 254. Such walls might have bends in it. In those instances, the distal end(s) of the walls might come to a point, form a ridge, be rounded or have any other shape. If a wall is used, for example, one wall could be sufficient to control the distance between the upper surface of the first element and the molding surface. Other shapes, beyond simply walls and pins, could be provided as well.

Although the objects suspended in the flowable material as discussed with reference to FIGS. 3A-3H are spherical, objects having other shapes (e.g., substantially ovoid, cubic, rectangular, cylindrical, conical, or irregularly shaped) can be used to control the distance between the first element and the molding element. Additionally, it is possible to use a combination of elements, such as suspended particles and pins together to control that distance. Additionally, it is possible to add the suspended objects to the flowable material after the flowable material has been selectively deposited.

A variety of curing agents can be used, including heat sources, ultraviolet energy sources, and/or any other curing agent appropriate for the particular implementation. Indeed, depending on the composition of the flowable material, the mere passage of time under ordinary ambient conditions can cure the flowable material. For example, many epoxy compositions can be cured in this manner. Curing can be facilitated or suspended at anytime in the process. Additionally, a compressive force can be applied or suspended between the first element and the molding element anytime.

In some implementations, the flowable material has no appreciable adhesiveness on its own. In those instances, a separate coating of adhesive material might be applied atop the flowable material during the processing. That coating might be applied either before or after molding. In a typical implementation, however, the flowable material is adhesive. The flowable material, typically, is curable by a curing agent such as ultraviolet energy, heat or simply by the passage of time. Although the term "flowable material" is used throughout the specification, it should be understood that the flowable material's ability to flow varies considerably throughout processing depending essentially on how much curing has taken place.

Moreover, the techniques described herein can be adapted to forming a wall structure in any kind of electronic device.

It is therefore to be understood that numerous modifications may be made to the illustrative embodiments and that other arrangements may be devised without departing from the spirit and scope of the present invention as defined by the appended claims.

What is claimed is:

1. A method of forming a wall structure in a microelectronic assembly, the method comprising:
   selectively depositing a flowable material on an upper surface of a first element of the microelectronic assembly by screen printing the flowable material at selected positions on the upper surface or utilizing a stencil to deposit the flowable material at selected positions on the upper surface;
   positioning a molding surface in contact with the deposited flowable material; and
   controlling a distance between the upper surface of the first element and the molding surface with one or more objects positioned between the upper surface and the molding surface.

2. The method of claim 1 wherein the one or more objects are pins having distal ends that extend from the molding surface toward the upper surface of the first element.

3. The method of claim 2 wherein the distal ends extend approximately equidistant from the molding surface.

4. The method of claim 2 further comprising applying a compressive force against an upper surface of the flowable material with the molding surface, thereby causing the distal ends of the pins to contact the upper surface of the first element.

5. The method of claim 4 wherein controlling the distance between the upper surface of the first element and the molding surface comprises using the pins to resist the applied compressive force.

6. The method of claim 1 wherein the one or more objects are particles suspended in the flowable material.

7. The method of claim 6 wherein the suspended particles are substantially spherical and have substantially identical diameters.

8. The method of claim 6 further comprising applying a compressive force to the flowable material with the molding surface and the first element until at least two of the suspended particles are in contact with both the upper surface of the first element and the molding surface.

9. The method of claim 8 wherein controlling the distance between the upper surface of the first element and the molding surface comprises using the suspended particles that are in contact with both the upper surface of the first element and the molding surface to resist the applied compressive force.

10. The method of claim 1 wherein a top surface of the flowable material is substantially planarized with the molding surface.

11. The method of claim 1 wherein the molding surface is part of an integrated circuit wafer, wherein the flowable material is an adhesive and wherein the method further comprises curing the adhesive to form a bond between the molding surface and the adhesive.

12. The method of claim 1 wherein the flowable material is an adhesive and molding surface is adapted to resist bonding to the adhesive, the method further comprising:

at least partially curing the adhesive while controlling the distance between the upper surface of the first element and the molding surface; and after at least partially curing the adhesive, removing the molding surface from the adhesive.

13. The method of claim 12 further comprising:
coupling a second element to the adhesive; and
further curing the adhesive to bond the second element to the adhesive.

14. The method of claim 1 wherein selectively depositing the flowable material comprises forming a side surface of flowable material adjacent that is adapted to resist flowing in an outward direction.

15. The method of claim 14 wherein the side surface is scalloped.

16. The method of claim 14 wherein the side surface is adjacent to a region selected from the group consisting of an image sensor region, an electrical contact region, a movable device region, a surface acoustic wave region and combinations thereof.

17. The method of claim 1 wherein the adhesive is ultraviolet curable,
wherein the first element is adapted to allow the passage of ultraviolet radiation sufficient to aid in curing the flowable material, and
wherein the method comprises at least partially curing the adhesive by passing ultraviolet light through the first element.

18. . The method of claim 1 wherein the first element is a transparent lid wafer formed from a material that readily permits the passage of light or other type of electromagnetic radiation.

* * * * *